(12) United States Patent
Wimpenny

(10) Patent No.: US 10,079,576 B2
(45) Date of Patent: Sep. 18, 2018

(54) ENVELOPE TRACKING MODULATOR WITH FEEDBACK

(71) Applicant: SNAPTRACK, INC., San Diego, CA (US)

(72) Inventor: Gerard Wimpenny, Oundle (GB)

(73) Assignee: SNAPTRACK, INC., San Diego, CA (US)

( * ) Notice: Subject to any disclaimer, the term of this patent is extended or adjusted under 35 U.S.C. 154(b) by 0 days.

(21) Appl. No.: 15/467,953

(22) Filed: Mar. 23, 2017

(65) Prior Publication Data
US 2017/0194915 A1 Jul. 6, 2017

Related U.S. Application Data

(63) Continuation of application No. 14/765,240, filed as application No. PCT/EP2014/051965 on Jan. 31, 2014, now Pat. No. 9,628,024.

(30) Foreign Application Priority Data

Feb. 1, 2013 (GB) .................................. 1301856.9

(51) Int. Cl.
H03G 3/20 (2006.01)
H03F 1/02 (2006.01)
(Continued)

(52) U.S. Cl.
CPC ............ *H03F 1/0238* (2013.01); *H02M 1/00* (2013.01); *H02M 3/158* (2013.01); *H03F 3/189* (2013.01);
(Continued)

(58) Field of Classification Search
CPC ........ H03G 3/20; H03F 1/0222; H03F 1/0227
(Continued)

(56) References Cited

U.S. PATENT DOCUMENTS 4,346,349 A 8/1982 Yokoyama
5,166,634 A * 11/1992 Narahashi ............. H03F 1/3235
330/151

(Continued)

FOREIGN PATENT DOCUMENTS

CN 101682302 A 3/2010
CN 103296977 A 9/2013
(Continued)

OTHER PUBLICATIONS

"Parent GB Patent Application No. GB 1301851.0 Search Report", dated Jul. 15, 2013, Publisher: GB IPO, Published in: GB.
(Continued)

*Primary Examiner* — Henry Choe
(74) *Attorney, Agent, or Firm* — Patterson & Sheridan, L.L.P.

(57) ABSTRACT

There is disclosed an envelope tracking modulated supply arranged to generate a modulated supply voltage in dependence on a reference signal, comprising a low frequency path for tracking low frequency variations in the reference signal and including a switched mode power supply, a correction path for tracking high frequency variations in the reference signal and including a linear amplifier, a feedback path from the output of the linear amplifier to the input of the linear amplifier, and a combiner for combining the output of the switched mode power supply and the output of the linear amplifier to generate a modulated supply voltage.

16 Claims, 5 Drawing Sheets

(51) Int. Cl.
  *H02M 3/158* (2006.01)
  *H02M 1/00* (2006.01)
  *H03F 3/189* (2006.01)
  *H03F 3/20* (2006.01)

(52) U.S. Cl.
  CPC ....... *H03F 3/20* (2013.01); *H02M 2001/0045* (2013.01); *H03F 2200/102* (2013.01); *H03F 2200/351* (2013.01); *H03F 2200/375* (2013.01); *H03F 2200/451* (2013.01)

(58) Field of Classification Search
  USPC .................................................. 330/127, 136
  See application file for complete search history.

(56) References Cited

U.S. PATENT DOCUMENTS

| | | | |
|---|---|---|---|
| 6,084,468 A | 7/2000 | Sigmon et al. | |
| 6,097,252 A | 8/2000 | Sigmon et al. | |
| 6,984,969 B1 | 1/2006 | Liu et al. | |
| 7,068,096 B2 * | 6/2006 | Chu | H03F 1/0227 330/10 |
| 7,482,869 B2 | 1/2009 | Wilson et al. | |
| 8,098,093 B1 | 1/2012 | Li | |
| 8,952,753 B2 * | 2/2015 | Tournatory | H02M 3/156 330/103 |
| 9,252,724 B2 | 2/2016 | Wimpenny | |
| 9,590,563 B2 | 3/2017 | Wimpenny | |
| 2004/0052312 A1 | 3/2004 | Matero | |
| 2004/0212437 A1 * | 10/2004 | Kim | H03F 1/0277 330/295 |
| 2005/0064830 A1 | 3/2005 | Grigore | |
| 2005/0122163 A1 | 6/2005 | Chu | |
| 2005/0271161 A1 | 12/2005 | Staszewski et al. | |
| 2006/0250825 A1 | 11/2006 | Grigore et al. | |
| 2007/0184795 A1 * | 8/2007 | Drogi | H03F 1/0205 455/127.1 |
| 2009/0191826 A1 | 7/2009 | Takinami et al. | |
| 2010/0194493 A1 | 8/2010 | Thompson | |
| 2011/0058601 A1 | 3/2011 | Kim et al. | |
| 2011/0089990 A1 | 4/2011 | Wimpenny | |
| 2012/0068767 A1 | 3/2012 | Henshaw et al. | |
| 2012/0126772 A1 | 5/2012 | Yamakoshi et al. | |
| 2012/0126893 A1 | 5/2012 | Yamanouchi et al. | |
| 2013/0116005 A1 | 5/2013 | Ganti et al. | |
| 2013/0217345 A1 | 8/2013 | Balteanu et al. | |
| 2014/0042999 A1 | 2/2014 | Barth et al. | |
| 2014/0218109 A1 | 8/2014 | Wimpenny | |
| 2015/0054588 A1 | 2/2015 | Wimpenny | |
| 2015/0365053 A1 | 12/2015 | Wimpenny | |
| 2016/0065139 A1 | 3/2016 | Lee et al. | |
| 2016/0226448 A1 | 8/2016 | Wimpenny | |

FOREIGN PATENT DOCUMENTS

| | | |
|---|---|---|
| GB | 2484475 A | 4/2012 |
| JP | S55149512 A | 11/1980 |
| JP | 2010508577 A | 3/2010 |
| JP | 2012114987 A | 6/2012 |
| WO | 2004075398 | 9/2004 |
| WO | WO-2008054906 A2 | 5/2008 |
| WO | 2010057773 | 5/2010 |
| WO | WO-2011013420 A1 | 2/2011 |

OTHER PUBLICATIONS

International Preliminary Report on Patentability—PCT/EP2014/051965 The International Bureau of WIPO—Geneva, Switzerland, dated Aug. 13, 2015.
International Search Report and Written Opinion—PCT/EP2014/051965—ISA/EPO—dated Sep. 30, 2014.

* cited by examiner

US 10,079,576 B2

ENVELOPE TRACKING MODULATOR WITH FEEDBACK

CROSS-REFERENCE TO RELATED APPLICATIONS

The present application is a Continuation of U.S. patent application Ser. No. 14/765,240 with a U.S. filing date of Jul. 31, 2015, which is a 371 filing of PCT/EP2014/051965, filed on Jan. 31, 2014, which in turn claims priority to British Application Number 1301856.9, filed on Feb. 1, 2013, all of which are assigned to the assignee of the present application and hereby expressly incorporated by reference herein in their entireties.

BACKGROUND TO THE INVENTION

Field of the Invention

The invention relates to envelope tracking modulated power supplies suitable for radio frequency power amplifier applications. The invention is particularly concerned with such power supplies in which a reference signal is used as an input to a low frequency path and a high frequency path, and in which each path generates separate outputs which are combined to form a supply voltage.

Description of the Related Art

Envelope tracking power supplies for radio frequency power amplifiers are well-known in the art. Typically a reference signal is generated based on an envelope of an input signal to be amplified. An envelope tracking power supply generates a supply voltage for the power amplifier which tracks the reference signal.

FIG. 1 shows a prior art envelope tracking (ET) modulator architecture in which a frequency splitter 12 is used to divide an incoming envelope reference signal on line 10 into a high frequency (HF) path signal on line 14 and a low frequency (LF) path signal on line 16. The frequency splitter 12 may include a low pass filter 18 in the low frequency path and a high pass filter 20 in the high frequency path. The signal in the LF path on line 16 is amplified by an efficient switched mode amplifier 22, and the signal in the HF path on line 14 is amplified by a wideband linear amplifier 24. A frequency selective combiner 26 is used to combine the signals in the LF and HF paths after their respective amplification. In FIG. 1 the combiner 26 is illustrated as including a low frequency combining element (and high frequency blocking element) 28 in the low frequency path, and a high frequency combining element (and low frequency blocking element) 30 in the high frequency path. A combined signal from the combiner 26 on line 32 provides a feed to a load 34 which for purposes of example is illustrated as a resistor. In a typical application the load is a power amplifier (PA), and the reference signal is derived from an input signal to be amplified by the power amplifier.

An example of a power amplifier system incorporating a supply architecture such as illustrated in FIG. 1 can be found in "Band Separation and Efficiency Optimisation in Linear-Assisted Switching Power Amplifiers", Yousefzadeh et al, [IEEE Power Electronics Specialists Conference 2006].

FIG. 2 shows an alternative prior art arrangement in which the frequency selective combiner 26 is an inductor-capacitor (LC) combiner. The low frequency combining element is an inductor 28a, and the high frequency combining element is a capacitor 30a. In this arrangement a feedback path 36 takes a signal from the combiner (or modulator) output on line 32 to the input of the linear amplifier 24. The signal on the feedback path 36 is subtracted from the signal in the high frequency path on line 14 by subtractor 38, to provide an input to the linear amplifier 24. The inclusion of the feedback path 36 achieves improved tracking accuracy compared to the arrangement of FIG. 1.

An example of a power amplifier system incorporating a supply architecture such as illustrated in FIG. 2 can be found in "Efficiency Optimization in Linear-Assisted Switching Power Converters for Envelope Tracking in RF Power Amplifiers", Yousefzadeh et al, [IEEE Symposium on Circuits and Systems 2005].

It is an aim of the invention to provide an envelope tracking modulated power supply which offers improved performance characteristics, including improved efficiency, over the prior art, such as the arrangements of FIGS. 1 and 2.

SUMMARY OF THE INVENTION

The invention provides an envelope tracking modulated supply arranged to generate a modulated supply voltage in dependence on a reference signal, comprising a low frequency path for tracking low frequency variations in the reference signal and including a switched mode power supply, a correction path for tracking high frequency variations in the reference signal and including a linear amplifier, a feedback path from the output of the linear amplifier to the input of the linear amplifier, and a combiner for combining the output of the switched mode power supply and the output of the linear amplifier to generate a modulated supply voltage.

The linear amplifier in the correction path may amplify a signal comprising the full spectrum of frequencies in the reference signal.

The envelope tracking modulated supply may further comprise a voltage source for providing an offset voltage in the signal in the correction path. The value of the offset voltage may be chosen to position the signal input to the linear amplifier to allow the lowest possible supply voltage for the linear amplifier.

The combiner may include an inductor at the output of the low frequency path and a capacitor at the output of the correction path, for combining the output signals of said path. The inductor may be connected between the output of the switched mode power supply and the supply output and the capacitor is connected between the output of the linear amplifier and the supply output. The combiner may further include a further inductor connected between the output of the switched mode power supply and the inductor, and a capacitor connected between the connection of the two inductors and electrical ground, wherein any ripple current as a result of the switching of the switched mode power supply is generated in the further inductor and shorted to ground through the capacitor.

The low frequency path may include a low pass filter for removing frequency components above a certain frequency from the low frequency path to generate a filtered reference signal for the low frequency path. The switched mode power supply may generate a switched supply voltage in dependence on the low pass filtered reference signal. The switched mode power supply may comprise a peak-current-mode switched supply. The envelope tracking modulated supply may comprise: a pulse width modulator for controlling switches for generating a switched mode voltage output in dependence on the low pass filtered reference signal; an inner feedback control loop for adapting the control to the pulse width modulator in dependence on the output current of the switches; and an outer feedback control loop for adapting the control to the pulse width modulator in dependence on the output voltage of the switched mode power supply.

The envelope tracking modulated supply may further comprise a delay in the correction path. The delay may be set to compensate for the delay associated with the switched mode power supply in the low frequency path.

The invention may provide an RF amplifier including an envelope tracking modulated supply.

The invention may provide a wireless communication system including an envelope tracking modulated power supply.

The invention may provide a wireless mobile device including an envelope tracking modulated power supply.

The invention also provides a method of an envelope tracking modulated supply arranged to generate a modulated supply voltage in dependence on a reference signal, comprising a low frequency path for tracking low frequency variations in the reference signal and including a switched mode power supply, a correction path for tracking high frequency variations in the reference signal and including a linear amplifier, the method comprising providing a feedback path from the output of the linear amplifier to the input of the linear amplifier, the envelope tracking modulator further comprising a combiner for combining the output of the switched mode power supply and the output of the linear amplifier to generate a modulated supply voltage.

BRIEF DESCRIPTION OF THE FIGURES

The invention is now described by way of example with reference to the accompanying Figures, in which.

DESCRIPTION OF THE PREFERRED EMBODIMENTS

In the following description the invention is described with reference to exemplary embodiments and implementations. The invention is not limited to the specific details of any arrangements as set out, which are provided for the purposes of understanding the invention.

With reference to the prior art arrangement of FIG. 1, the signals in the high frequency path at the input to the linear amplifier 24 on line 14 contain largely no frequencies below a certain cut-off frequency due to the effect of the high-pass filter 20. Thus low frequency signals (signals below the cut-off frequency of filter 20) are substantially absent.

Figure 1:
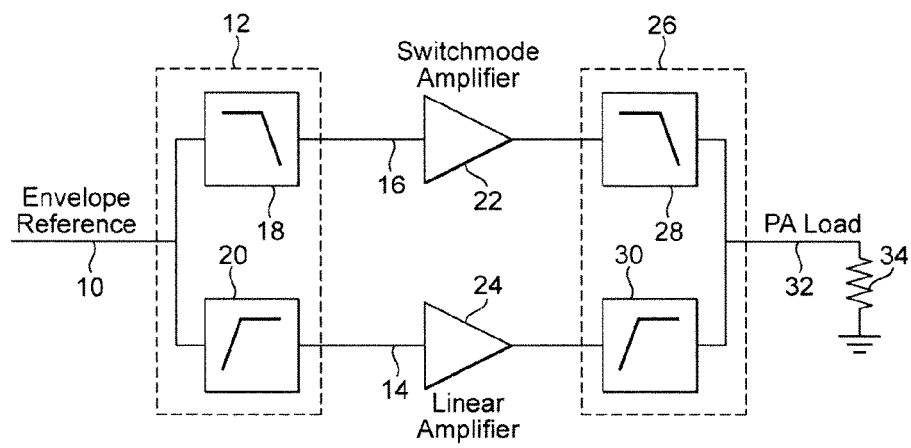
FIG. 1 illustrates a prior art envelope tracking modulated supply including a low frequency path and a high frequency correction path.

In the arrangement of FIG. 1 the absence of signals below particular frequencies results in a peak-to-peak amplitude of the signal at the output of the linear amplifier 24 which is greater than the peak-to-peak amplitude would be if the full spectrum envelope signal were present. This reduces the efficiency of the linear amplifier 24, as its supply rails must be set to allow linear amplification of this larger peak-to-peak signal.

Figure 3:
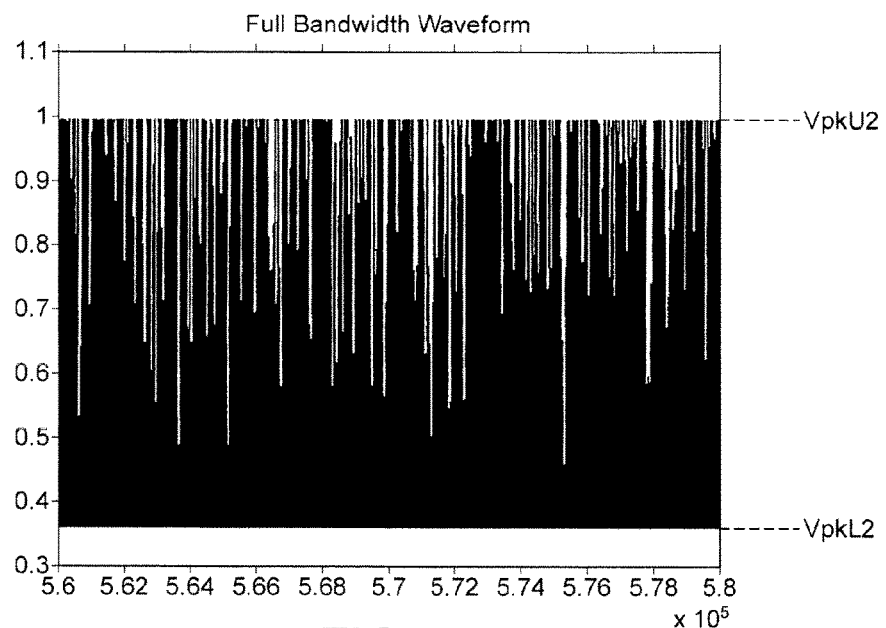
FIG. 3 illustrates the power variation of an exemplary full-spectrum signal.
Figure 4:
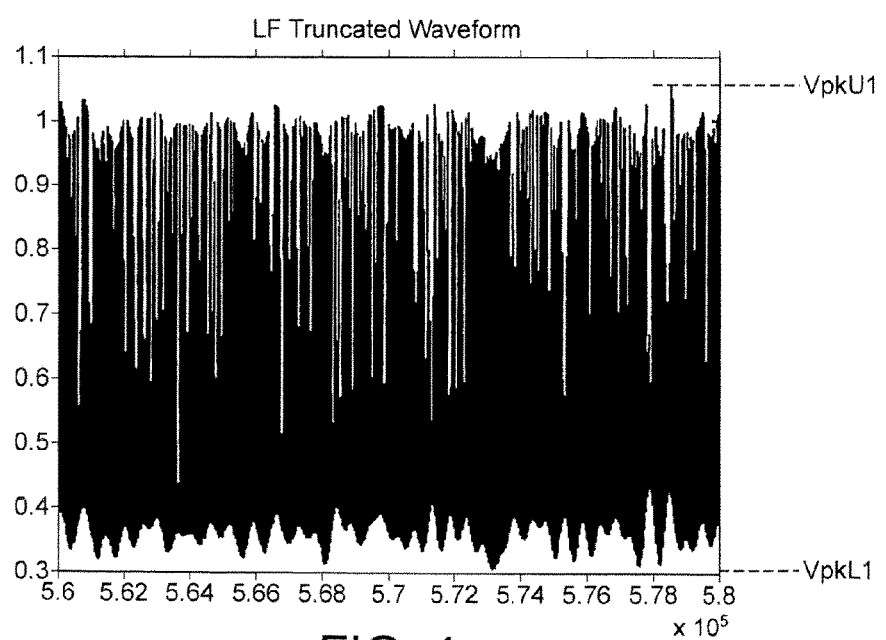
FIG. 4 illustrates the power variation of an exemplary full-spectrum signal with low frequency content removed.

With reference to FIGS. 3 and 4 this can be further understood. FIG. 3 illustrates how the full bandwidth envelope reference waveform on line 10 of FIG. 1 varies between a minimum peak $V_{pkL2}$ and a maximum peak $V_{pkU2}$.

FIG. 4 illustrates the waveform for the same signal but with low frequency content filtered off. This represents the signal on line 14. This waveform varies between a minimum peak $V_{pkL1}$ and a maximum peak $V_{pkU1}$. As can be seen in FIG. 4, there is a significant amount of variation of the lower and upper extremes of the waveform which results in increased peak-to-peak signal amplitude compared to the waveform of FIG. 3. The variation between the peaks $V_{pkL2}$ and $V_{pkU2}$ in FIG. 3 is less than the variation between the peaks $V_{pkL1}$ and $V_{pkU1}$ in FIG. 4.

Figure 2:
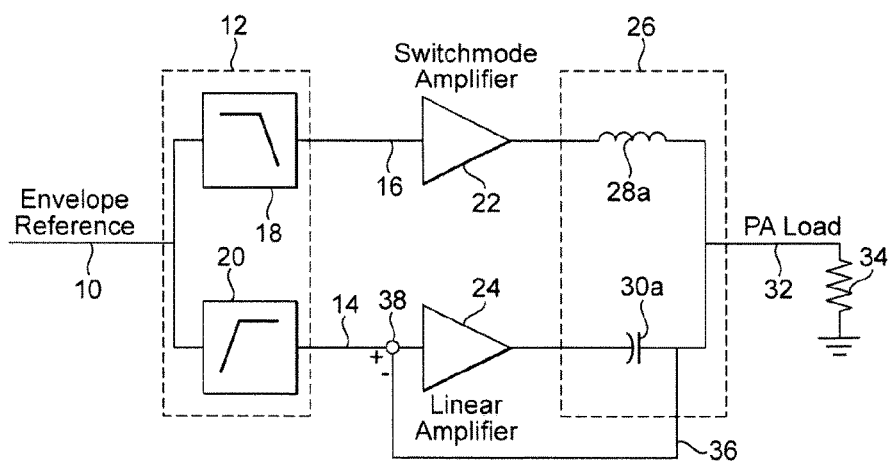
FIG. 2 illustrates a prior art envelope tracking modulated supply incorporating feedback in the high frequency correction path.

A similar problem occurs with the arrangement of FIG. 2. This problem occurs in the arrangement of FIG. 2 even if the high-pass filter 20 is not present. In this case the action of the feedback on the feedback path 36 is to remove the low frequency content of the signal on line 14 from the input to the linear amplifier 24. This occurs because the low frequency content of the signal at the combined output on line 32 is the same as the low frequency content of the envelope reference signal on line 10, as it is provided by the switched mode amplifier path. This results in the low frequency signal content being removed at the output of the subtractor 38 in the arrangement of FIG. 2 such that the linear amplifier 24 is required to amplify a signal without low frequency content.

Thus the linear amplifier 24 in either of the arrangements of FIG. 1 or FIG. 2 is required to provide an amplified signal on its output which is not a full spectrum signal, and which therefore requires a larger peak-to-peak power supply for the amplifier.

Figure 5:
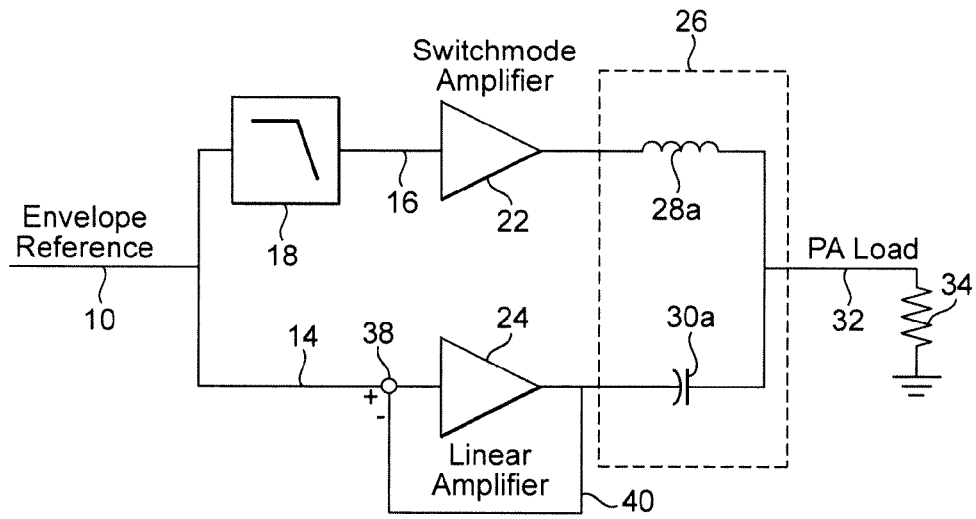
FIG. 5 illustrates an improved envelope tracking modulated supply incorporating a feedback arrangement in the high frequency correction path in accordance with an embodiment of the invention.

With reference to FIG. 5 there is illustrated an architecture of an envelope tracking modulator in accordance with an embodiment of the invention which addresses the above-described problems. In the Figures as a whole elements which correspond to elements in other Figures are referred to by like reference numerals.

In accordance with the invention, the envelope tracking modulated supply comprises a low frequency path comprising a switched mode amplifier for tracking low frequency variation in a reference signal and for generating a switched mode voltage. Also provided is a correction path comprising a linear amplifier for tracking high frequency variations in the reference signal and for generating a correction voltage. The correction voltage is combined with the switched mode voltage to provide a modulated supply voltage. A feedback path is provided from the output of the linear amplifier to the input of the linear amplifier.

In a preferred embodiment, the correction path delivers a signal representing the full spectrum of the reference signal to the linear amplifier. Thus, as illustrated in FIG. 5, the high-pass filter 20 of FIGS. 1 and 2 is preferably eliminated such that the path comprising the signal on line 14 is no longer a high frequency path, and may therefore now be referred to simply as a correction path. The signal on line 14 is the full spectrum of the reference signal on line 10, and may alternatively be referred to as the unfiltered reference signal.

As also illustrated in FIG. 5, in accordance with the invention a feedback path 40 connects the output of the linear amplifier to an input of the subtractor 38. The input to the linear amplifier 24 is thus the full bandwidth signal on line 14 in the correction path minus the signal on the feedback path 40. The feedback signal is taken from the output of the correction path before combining and therefore the low frequency content at the output is not removed in the subtraction operation.

The feedback path 40, taken from the output of the linear amplifier 24, provides a feedback signal which is subtracted from the reference signal to derive a correction signal. This is achieved by the connection of the feedback path at the output of the linear amplifier before the combining element (capacitor 30*a*), rather than after the combining element (capacitor 30*a*).

The signal at the output of the linear amplifier 24 is a full spectrum signal. Hence the signal processed by the linear amplifier 24 in FIG. 5 does not have to process the larger peak-to-peak signal of FIG. 4, which it would have to handle in the arrangements of FIGS. 1 and 2.

In a preferred arrangement, to achieve maximum linear amplifier efficiency, the linear amplifier 24 is preferably always operated with the minimum possible supply voltage, which is provided by an efficient switched mode supply (not illustrated in the Figures). The supply voltage to the linear amplifier in the arrangement of FIG. 5 can be reduced compared to the prior art arrangement of FIGS. 1 and 2 in order to provide improved efficiency.

In FIG. 5 the absence of a high pass filter in the correction path, such as filter 20 in the arrangement of FIGS. 1 and 2, may not be essential. An efficiency benefit may result if feedback is taken directly from the input of the combiner 26, rather than the output, even if the high pass filter 20 is present. In particular if the cut-off frequency of such a high pass filter is lower than the cut-off frequency of the switched mode amplifier path, an efficiency benefit will be seen.

As noted above, however, the preferred arrangement is to (i) provide a feedback from the output of the linear amplifier before the combining stage to the input of the linear amplifier; and (ii) deliver the full spectrum reference signal to the input of the linear amplifier. This minimises the supply voltage required for the linear amplifier in the correction path.

In the arrangement of FIG. 5, and in subsequent described arrangements, the linear amplifier in the correction path is illustrated as having unity gain. This is for simplicity of explanation, and in other arrangements the linear amplifier may have non-unity gain.

Certain further improvements may be made to the envelope tracking modulator including the advantageous feedback architecture as illustrated in FIG. 5, as described further herein with reference to FIGS. 6 to 9. These improvements may be applied individually or in combination.

Figure 6:
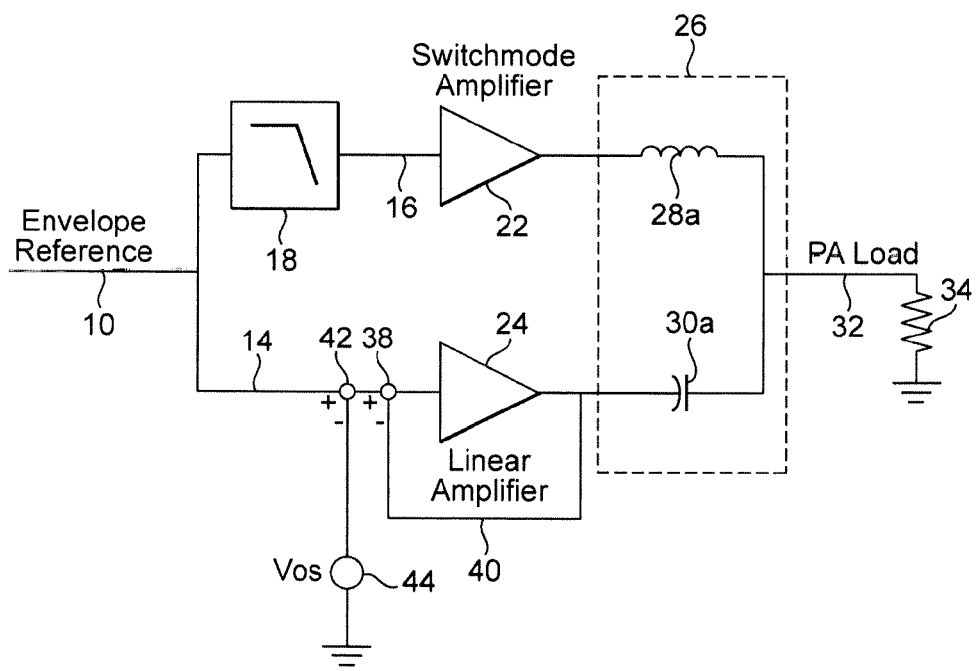
FIG. 6 illustrates the improved envelope tracking modulated supply incorporating feedback in the high frequency correction path and additionally a DC offset in the high frequency correction path, in accordance with an embodiment of the invention.

To maximise efficiency, as shown in FIG. 6 a DC offset is preferably added to the input signal in the correction path to allow rail-to-rail operation of the linear amplifier 24. Thus as illustrated, a subtractor 42 is arranged to receive the signal in the correction path on line 14, and subtract therefrom a DC offset voltage $V_{OS}$ provided by a voltage source 44. The output of the subtractor 42 provides an input to the subtractor 38, such that the subtractor 38 subtracts the feedback signal on feedback path 40 from the offset full-spectrum signal at the output of the subtractor 42. The value of the DC offset voltage is chosen to position the DC voltage at the output of the subtractor 42 to allow the lowest possible supply voltage to be used for the linear amplifier 24, whilst still maintaining linear operation.

A disadvantage of the arrangements of FIGS. 5 and 6 is that a triangular ripple current flows in the inductor 28*a* as a result of the switching of the switched mode amplifier 22. This triangular ripple current flowing in the inductor 28*a* must be shunted through the output stage of the linear amplifier 24, i.e. the capacitor 30*a*, in order to avoid the creation of unwanted voltage errors at the output of the combiner 26, and hence on the modulator output on line 32. The consequential ripple current flowing through the output of the linear amplifier 24 reduces its efficiency.

Figure 7:
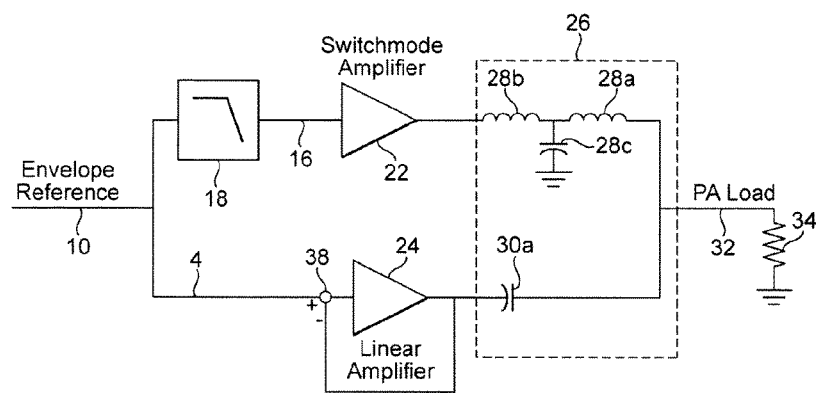
FIG. 7 illustrates the improved envelope tracking modulated supply incorporating feedback in the high frequency correction path and switcher ripple current elimination in the low frequency path, in accordance with an embodiment of the invention.

FIG. 7 shows a further embodiment of the invention in which the frequency combiner 26 of FIG. 5 is adapted to include an additional capacitor 28*c* and inductor 28*b* as part of the low frequency combining element. The magnitude of the coupling factor between inductors 28*a* and 28*b* may range between 0 and 1. The inductor 28*b* is connected between the output of the switched mode amplifier 22 and the inductor 28*a*. The capacitor 28*c* is connected between the junction of inductors 28*a* and 28*b*, and electrical ground.

In the modified arrangement of FIG. 7 the ripple current due to the switched mode amplifier 22 now flows in the inductor 28*b* and is now shunted to electrical ground via the capacitor 28*c*. The loss associated with the ripple current flowing in inductor 28*a* and passing through the linear output stage in the FIG. 5 or FIG. 6 arrangement is now avoided.

Figure 8:
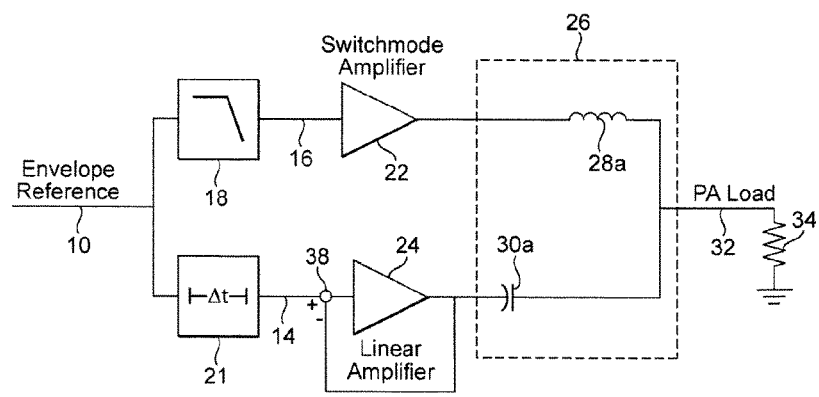
FIG. 8 illustrates the improved envelope tracking modulated supply incorporating feedback in the high frequency correction path and a delay in the high frequency correction path, in accordance with an embodiment of the invention.

In a still further arrangement, as illustrated in FIG. 8, the delay associated with the switched mode amplifier 22 in the low frequency path may optionally be compensated for in the correction path using a delay matching element in the high frequency path including the linear amplifier 24. This is illustrated in FIG. 8 by the inclusion of a variable delay element 21 in the correction path. The reference signal on line 10 is delivered to the subtractor 38 via the delay matching element 21.

In a preferred arrangement the LF path switched mode amplifier 22 is preferably implemented as a peak-current-mode buck-converter which is a known prior art technique for implementing high bandwidth switched mode power supplies. An exemplary implementation of a peak-current-mode buck-converter for the switched mode amplifier 22 is illustrated in FIG. 9.

Figure 9:
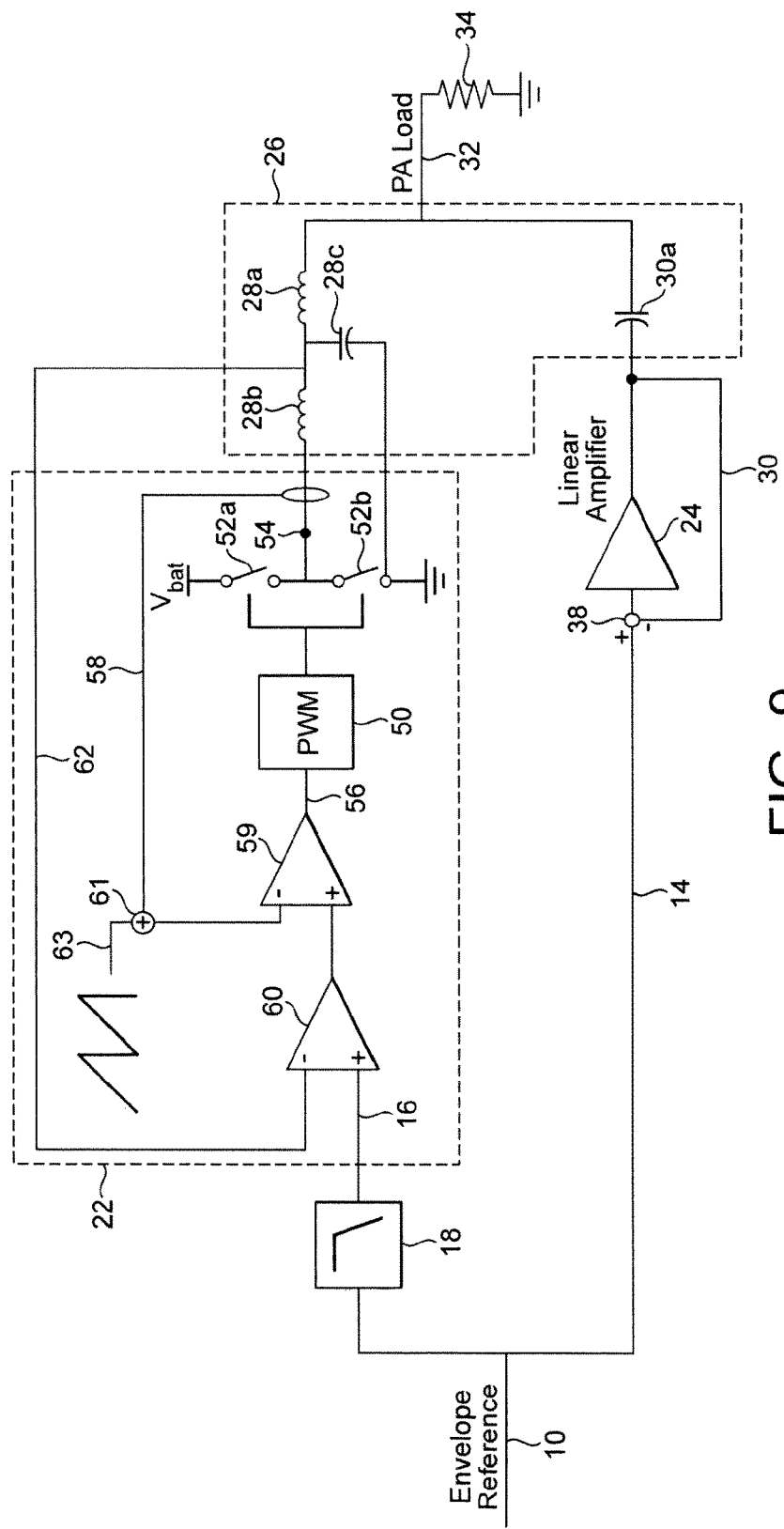
FIG. 9 illustrates the improved envelope tracking modulated supply incorporating feedback in the high frequency correction path and an exemplary implementation of the switched mode supply.

As illustrated in FIG. 9, the switched mode amplifier 22 includes a pulse width modulator (PWM) 50 which receives a control signal on line 56, and which controls a pair of switches 52*a* and 52*b*. Switch 52*a* is connected between a supply voltage and a common node 54, and switch 52*b* is connected between the common node 54 and electrical ground. The supply voltage is provided by a battery, and is denoted Vbat. The pulse width modulator 50 controls the switches 52*a* and 52*b* to provide the low frequency path output to the combiner 26 in dependence on the control signal on line 56. The arrangement of a pulse width modulator and output switches is known in the art.

The switched mode amplifier 22 includes an inner current control feedback loop and an outer voltage control feedback loop.

The inner current control feedback loop senses the inductor current flowing in inductor 28b either directly or indirectly by sensing current in switch 52a or switch 52b, and provides a feedback path 58 to a combiner 61. The combiner 61 combines the feedback signal on feedback path 58 with a compensation ramp signal on line 63. The output of the combiner 61 provides an input to the inverting input of an amplifier 59. The amplifier 59 receives at its non-inverting input an output from an amplifier 60. The amplifier 59 generates the control signal on line 56.

The outer voltage control feedback loop provides a voltage feedback path 62 from the second terminal of the inductor 28b, where it connects to the inductor 28a and capacitor 28c. The feedback path 62 provides a feedback signal to an inverting input of the amplifier 60. The amplifier 60 receives the low frequency path signal on line 16 at its non-inverting input.

Inductor 28b behaves as a current source due to the action of the inner current feedback loop provided by feedback path 58. A compensation ramp is provided on line 63 in this inner current feedback loop, and is used to prevent frequency halving at high duty cycles.

The outer voltage feedback loop provided by feedback path 62 is used to control the voltage at the junction of inductor 28b, inductor 28a, and capacitor 28c.

The peak-current-mode buck-converter as illustrated in FIG. 9 operates, in general, as follows.

The low pass filter 18 generates a signal representing low frequency variation in the reference signal. This signal on line 16 then comprises a control signal for the pulse signal for the buck switcher, comprising switches 52a and 52b, which has a duty cycle determined by the control signal, such that the voltage at the output of the buck switcher tracks the signal on line 16, i.e. the low frequency variation in the reference signal.

In addition, however, this control signal on line 16 is modified by the inner feedback current control loop and the outer feedback voltage control loop.

The outer feedback voltage control loop firstly adjusts the control signal in amplifier 60. The control signal (i.e. the low frequency reference signal) has the feedback signal on feedback path 62 removed therefrom. The feedback voltage on feedback path 62 represents the voltage at the output of the low frequency path, and the removal of this voltage from the low frequency reference signal on line 16 provides a signal representing the error between the output voltage and the reference voltage.

The inner feedback control loop secondly adjusts the control signal in amplifier 59. The second adjusted control signal (output from amplifier 59) has the feedback signal on feedback path 58 removed therefrom. The feedback signal on feedback path 58 represents the error in the output current.

Each of the additional arrangements of FIGS. 6 to 9 may be implemented separately or in any combination with the feedback architecture illustrated in FIG. 5, in order to provide one or more further improvements to the feedback arrangement.

The invention and its embodiments relates to the application of envelope tracking (ET) to radio frequency (RF) power amplifiers, and is applicable to a broad range of implementations including cellular handsets, wireless infrastructure, and military power amplifier applications at high frequencies to microwave frequencies.

The invention has been described herein by way of example with reference to embodiments. The invention is not limited to the described embodiments, nor to specific combinations of features in embodiments. Modifications may be made to the embodiments within the scope of the invention. The scope of the invention is defined by the appended claims.

The invention claimed is:

1. An envelope tracking modulated supply, comprising:
   a low frequency path configured to receive a reference signal and track low frequency variations in the reference signal and including a switched mode power supply;
   a correction path configured to track high frequency variations in the reference signal and including:
      a linear amplifier;
      a subtractor having a first input coupled to an output of the linear amplifier and a second input coupled to the reference signal, wherein an output of the subtractor is coupled to the input of the linear amplifier; and
      a voltage source configured to provide an offset voltage in the reference signal in the correction path, wherein the voltage source is coupled to the input of the linear amplifier; and
   a combiner configured to combine an output of the low frequency path and an output of the correction path to generate a modulated supply voltage.

2. The envelope tracking modulated supply of claim 1, wherein the linear amplifier in the correction path is configured to amplify a signal comprising the full spectrum of frequencies in the reference signal.

3. The envelope tracking modulated supply of claim 1, wherein the value of the offset voltage is chosen to position a signal input to the linear amplifier to allow the lowest possible supply voltage for the linear amplifier.

4. The envelope tracking modulated supply of claim 1, wherein the combiner includes a first inductor coupled to the output of the low frequency path and a first capacitor coupled to the output of the correction path, for combining the outputs of the paths.

5. An envelope tracking modulated supply, comprising:
   a low frequency path configured to receive a reference signal and track low frequency variations in the reference signal and including a switched mode power supply;
   a correction path configured to track high frequency variations in the reference signal and including:
      a linear amplifier; and
      a subtractor having a first input coupled to an output of the linear amplifier and a second input coupled to the reference signal, wherein an output of the subtractor is coupled to the input of the linear amplifier; and
   a combiner configured to combine an output of the low frequency path and an output of the correction path to generate a modulated supply voltage,
   wherein the combiner includes a first inductor coupled to the output of the low frequency path and a first capacitor coupled to the output of the correction path, for combining the outputs of the paths, wherein the first inductor is coupled between an output of the switched mode power supply and an output of the envelope tracking modulated supply, and the first capacitor is coupled between the output of the linear amplifier and the output of the envelope tracking modulated supply.

6. An envelope tracking modulated supply, comprising:
a low frequency path configured to receive a reference signal and track low frequency variations in the reference signal and including a switched mode power supply;
a correction path configured to track high frequency variations in the reference signal and including:
a linear amplifier; and
a subtractor having a first input coupled to an output of the linear amplifier and a second input coupled to the reference signal, wherein an output of the subtractor is coupled to the input of the linear amplifier; and
a combiner configured to combine an output of the low frequency path and an output of the correction path to generate a modulated supply voltage,
wherein the combiner includes a first inductor coupled to the output of the low frequency path and a first capacitor coupled to the output of the correction path, for combining the outputs of the paths, wherein the combiner further comprises a second inductor coupled between an output of the switched mode power supply and the first inductor, and a second capacitor connected between a node between the first and second inductors and electrical ground.

7. The envelope tracking modulated supply of claim 1, wherein the low frequency path includes a low pass filter configured to remove frequency components above a certain frequency from the low frequency path to generate a low pass filtered reference signal for the low frequency path.

8. The envelope tracking modulated supply of claim 7, wherein the switched mode power supply is configured to generate a switched supply voltage in dependence on the low pass filtered reference signal.

9. The envelope tracking modulated supply of claim 1, further comprising a variable delay in the correction path.

10. The envelope tracking modulating supply of claim 9, wherein the variable delay is set to compensate for a delay associated with the switched mode power supply in the low frequency path.

11. The envelope tracking modulated supply of claim 9, wherein the first input of the subtractor is connected to an output of the variable delay.

12. The envelope tracking modulated supply of claim 1, wherein the switch mode power supply comprises a peak-current-mode buck-converter.

13. An envelope tracking modulated supply, comprising:
a low frequency path configured to receive a reference signal and track low frequency variations in the reference signal, to generate a low pass filtered reference signal for the low frequency path, and including a switched mode power supply, wherein the switch mode power supply comprises a peak-current-mode buck-converter;
a correction path configured to track high frequency variations in the reference signal and including:
a linear amplifier; and
a subtractor having a first input coupled to an output of the linear amplifier and a second input coupled to the reference signal, wherein an output of the subtractor is coupled to the input of the linear amplifier; and
a combiner configured to combine an output of the low frequency path and an output of the correction path to generate a modulated supply voltage,
wherein the switched mode power supply comprises:
a pulse width modulator configured to control switches to generate a switched mode voltage output in dependence on the low pass filtered reference signal;
an inner feedback control loop configured to adapt control to the pulse width modulator in dependence on an output current of the switches; and
an outer feedback control loop configured to adapt control to the pulse width modulator in dependence on an output voltage of the switched mode power supply.

14. A method of generating, with an envelope tracking modulated supply, a modulated supply voltage in dependence on a reference signal, the envelope tracking modulated supply comprising a low frequency path including a switched mode power supply and a correction path including a linear amplifier, the method comprising:
receiving the reference signal with the low frequency path;
tracking low frequency variations in the reference signal with the low frequency path;
removing frequency components above a certain frequency from the low frequency path to generate a low pass filtered reference signal for the low frequency path;
generating, with the switched mode power supply, a switched supply voltage in dependence on the low pass filtered reference signal;
offsetting a voltage of the reference signal in the correction path;
tracking high frequency variations in the reference signal with the correction path;
feeding back an output of the linear amplifier to an input of the linear amplifier; and
combining an output of the low frequency path and an output of the correction path to generate the modulated supply voltage.

15. The method of claim 14, further comprising amplifying, with the linear amplifier, a signal comprising the full spectrum of frequencies in the reference signal.

16. The method of claim 14, wherein feeding back the output of the linear amplifier comprises subtracting the output of the linear amplifier from the reference signal to generate the input of the linear amplifier.

* * * * *